United States Patent
Kang et al.

(10) Patent No.: US 10,177,741 B1
(45) Date of Patent: Jan. 8, 2019

(54) ENVELOPE TRACKING ACTIVE CIRCULATOR

(71) Applicant: HRL Laboratories, LLC, Malibu, CA (US)

(72) Inventors: Jongchan Kang, Moorpark, CA (US); Hasan Sharifi, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 156 days.

(21) Appl. No.: 15/240,992

(22) Filed: Aug. 18, 2016

Related U.S. Application Data

(60) Provisional application No. 62/208,419, filed on Aug. 21, 2015.

(51) Int. Cl.
H03H 11/38 (2006.01)
H03H 11/04 (2006.01)

(52) U.S. Cl.
CPC .................................. H03H 11/04 (2013.01)

(58) Field of Classification Search
CPC ...... H03H 11/02; H03H 11/326; H03H 11/38; H03H 11/363; H03F 3/604
USPC .............................. 333/1, 1.1, 118, 120–128
See application file for complete search history.

(56) References Cited

U.S. PATENT DOCUMENTS

| | | | |
|---|---|---|---|
| 4,908,531 A * | 3/1990 | Podell | H03K 17/6871 327/409 |
| 5,101,179 A | 3/1992 | Jarrett et al. | |
| 5,144,266 A * | 9/1992 | Dougherty | H03H 11/38 330/277 |
| 8,717,117 B2 * | 5/2014 | Mung | H01P 1/38 333/100 |
| 9,641,156 B1 * | 5/2017 | Kang | H03H 11/38 |
| 9,893,401 B2 * | 2/2018 | Kang | H03H 11/38 |
| 2006/0087376 A1 | 4/2006 | Young et al. | |
| 2013/0147535 A1 | 6/2013 | Hur et al. | |
| 2013/0169367 A1 | 7/2013 | Vickes et al. | |

OTHER PUBLICATIONS

U.S. Appl. No. 14/554,995, filed May 2016, Kang et al.

(Continued)

*Primary Examiner* — Dinh T Le
(74) *Attorney, Agent, or Firm* — Ladas & Parry

(57) ABSTRACT

Several embodiments of an envelope tracking active circulator is disclosed with a method to cascade them. In an active transistor based circulator (active circulator), gate (base) and drain (collector) bias voltage can be adjusted by RF or microwave input envelop signal. This is called envelop tracking active circulator. In this concept, input RF signal is detected by detection circuit, such as detection diode or coupler and converted into low frequency envelop signal by the proper filtering circuitry. The generated envelop signal controls the supply voltage of the drain and gate with the proper function of the envelop signal to improve active circulator insertion loss, isolation and power handling capability. This concept can be applied to any type of solid-state FET (Field effect transistor) transistor based active circulator, as long as they have bias dependent trans-conductance and capacitances inside. For a BJT (bipolar junction transistor) based active circulator, base bias current supply modulator will be used instead of voltage supply modulator.

28 Claims, 8 Drawing Sheets

(56) References Cited

OTHER PUBLICATIONS

International Search Report & Written Opinion for PCT/US14/67742 dated Jul. 30, 2015.
Tanaka et al., Active Circulators—The Realization of Circulators using Transistors, Proceeding of the IEEE, vol. 53, Issue 3, pp. 260-267, Mar. 1965.
Shin et al., "A 1.5-9.6 GHz Monolithic Active Quasi-Circulator in 0.18 μm CMOS Technology", IEEE Microwave and Wireless Components letters, vol. 18 No. 12, pp. 797-799, Dec. 2008.
Smith, Mark A, "GaAs Monolithic Implementation of Active Circulators", IEEE Microwave Symposium, pp. 1015-1016, 1988.
U.S. Appl. No. 14/554,995, Kang et al., filed Nov. 26, 2014.
Tanaka, S.; Shimomura, N.; Ohtake, K., "Active circulators—The Realization of Circulators using Transistors," Proceedings of the IEEE, Mar. 1965, vol. 53, No. 3, pp. 260-267.

\* cited by examiner

Figure 2 (Disclosed in application #14/554,995)

ENVELOPE TRACKING ACTIVE CIRCULATOR

CROSS REFERENCE TO RELATED APPLICATIONS

This non-provisional application claims the benefit of and priority to U.S. Ser. No. 62/208,419 filed on Aug. 21, 2015 which is incorporated herein by reference.

INCORPORATED BY REFERENCE

This non-provisional application incorporates by reference the contents of U.S. Ser. No. 14/554,995 filed on Nov. 26, 2014.

TECHNICAL FIELD

The present disclosure is directed in general to the field of circulators and in particular to active circulators.

BACKGROUND OF THE DISCLOSURE

A circulator is a device with three or more ports where a microwave or RF signal is transferred from one port to the next in a prescribed order. A variety of circulators are known. However, some of these include active circulators. Typical active circulator consists of active transistors and each source (or emitter) of the transistors are tied together (common node).

Prior arts suffer from DC power loss leading to less efficiency, significant insertion loss and port isolation issues. FIG. 1 shows a prior art three port active circulator. The port numbers are labeled and as can be seen, the direction of transfer is clockwise. In this prior art circulator, the drain bias voltages ($V_{dd}$) are directly connected to three drain resistors and the drain currents flow thought these drain resistors. The common node, where the sources of the transistors are tied together, is grounded to $V_{ss}$ through common a ground resistor. There are significant voltage drops through these various resistors causing DC power consumption to occur making these circulators less energy efficient. If these drain resistors and common source resistors are not of high enough value, there can be significant RF power loss as well. The voltage drops across these resistors also limit the maximum RF voltage swing across each transistor, thus limiting the power handling capacity of these circulators.

Also in FIG. 1, there are three other resistors bypassed with the capacitors in parallel (R1-C1, R2-C2, R3-C3)) which form RF feedback networks. These RF feedback networks are typically used in an active circulator in order to adjust transconductance of the transistors. The active circulator operation is very sensitive to RF transconductance and it affects circulator loss and isolation parameters and the resulting performance.

An improved active circulator is disclosed in application Ser. No. 14/554,995 as shown in FIG. 2. In order to improve the power efficiency, and increase the power handling capacity of the circulator, drain resistors are eliminated in FIG. 2. In order to make a circulator operational, its common source node has to be connected to the ground through the resistor ($R_c$) or resistor and inductor in parallel ($R_c$ and $L_c$ in parallel) as shown in FIG. 2. Under the small signal operation, the common node voltage is almost a constant, since common node current flowing doesn't change that much. But, once a large signal is applied, common node current keep increasing over the power level and corresponding common node voltage keeps rising (DC or AC). In an active circulator, the control of various biases is critical. In this case, each transistor gate bias has to be set around unit current gain point to make closed loop circulator stable. Once this low gate bias point moves off from the original point by the power increase (common node voltage change), the active circulator will lose the circulation and isolation. Typically, large signal power increases the common node voltage and effective gate-source voltage ($V_{gs}$) of each transistor becomes lower than the original setting. Effective drain to source voltage ($V_{ds}$) will also experience the same by the large signal. These changes in $V_{gs}$ and $V_{ds}$ worsen the circulator loss and isolation parameters, affecting the circulator performance.

Circulators have numerous uses. For example, one port of a three port circulator may be connected to an antenna, while a receiver is connected to a second port of the circulator to receive signals received by the antenna and with a transmitter connected to a third port of the circulator to supply transmit signals to the antenna (with the transmit signals being isolated by the circulator from the receiver which might otherwise be damaged by the transmit signals).

SUMMARY OF THE DISCLOSURE

To address one or more of the above-deficiencies of the prior art, one embodiment described in this disclosure provides for a bias controlled active circulator comprising, a plurality of transistors configured as an active circulator having three or more ports and having one or more common gate biases and one or more common drain biases; and one or more envelope bias controllers that generate the one or more common gate biases and the one or more common drain biases, wherein each of the common gate biases and each of the common drain biases is modulated by a power envelope of a signal input to one of the ports of the circulator.

Another embodiment described in this disclosure provides for a bias controlled active circulator comprising, a plurality of transistors configured as an active circulator having three or more ports and having one or more common gate biases or one or more common drain biases, and one or more envelope bias controllers that generate the one or more common gate biases or the one or more common drain biases, wherein each of the common gate biases or each of the common drain biases is modulated by a power envelope of a signal input to one of the ports of the circulator.

Another embodiment described in this disclosure provides for a bias controlled active circulator comprising, a plurality of bipolar junction transistors (BJTs) configured as an active circulator having three or more ports and one or more common base nodes, and one or more envelope base controllers that control base current supply to the one or more common base nodes, wherein the base current supply to each of the common base nodes is modulated by a power envelope of a signal input to one of the ports of the circulator.

A cascaded bias controlled active circulators is disclosed, comprising a plurality of active circulators, wherein each of the circulators plurality of ports and having a port connected to a port of another circulator forming a chain; each of the circulators having a plurality of transistors configured as an active circulator and the transistors in the plurality of active circulators forming groups where each group has a common gate bias and a common drain bias and one or more envelope bias controllers that generate the one or more common gate biases and the one or more drain common biases, wherein each of the common gate biases and each of the common drain biases are modulated by a power envelope of a signal input to one of the ports of the circulator.

Yet another embodiment described in this disclosure provides for a bias controlled multi port active circulator comprising, a plurality of FET transistors forming a plurality of ports, a plurality of first RF chokes and a plurality of second RF chokes, where each of FET transistor of said plurality having a gate connected to an associated port of said multi-port active circulator via a capacitor of an associated one of said first RF chokes, each of said first RF chokes being connected through a first inductor to a common gate bias; a source connected to a common point that is connected to a first resistor in parallel with a second inductor wherein both the first resistor and the second inductor are grounded and a drain connected to the gate of the same FET transistor by a feedback circuit and connected to the gate of a neighboring FET transistor via a capacitor of one of the second RF chokes, each of the second RF chokes coupling bases and drains of neighboring FET transistors via the capacitors thereof and each of the second RF chokes being connected to a common drain bias and one or more envelope bias controllers that supply the common gate bias and the common drain bias, wherein the common gate bias and the common drain bias are modulated by a power envelope of a signal input to one of the ports of the circulator.

Certain embodiments may provide various technical features depending on the implementation. For example, a technical feature of some embodiments may include the capability to provide low loss and high isolation. Other embodiments may provide for increased power handling capability. Some embodiments may provide for increased power efficiency.

Although specific features have been enumerated above, various embodiments may include some, none, or all of the enumerated features. Additionally, other technical features may become readily apparent to one of ordinary skill in the art after review of the following figures and description.

BRIEF DESCRIPTION OF THE DRAWINGS

For a more complete understanding of the present disclosure and its features, reference is now made to the following description taken in conjunction with the accompanying drawings, in which like reference numerals represent like parts.

DETAILED DESCRIPTION

It should be understood at the outset that, although example embodiments are illustrated below, the present technology may be implemented using any number of techniques, whether currently known or not. The present technology should in no way be limited to the example implementations, drawings, and techniques illustrated below. Additionally, the drawings are not necessarily drawn to scale.

In order to overcome the deficiencies of the prior art and to increase the efficiency and the power handling capacity of active circulators while lowering the insertion loss and improving the port-to-port isolation, an envelope tracking isolator concept is proposed according to an embodiment of the present disclosure. In an active transistor based circulator (active circulator), gate (or base) and drain (or collector) bias voltage can be adjusted by RF input envelope signal. This is called envelope tracking active circulator. In this concept, input RF signal is detected by a detection circuit, such as a detection diode or a coupler and converted into low frequency envelope signal by the proper filtering circuitry. The generated envelope signal controls the supply voltage of the drain and gate with the proper function of the envelope signal to improve active circulator insertion loss, isolation and power handling capability. This concept can be applied to any type of solid-state FET (Field effect transistor) based active circulator, as long as they have bias dependent transconductance and capacitances inside the circulator. For a BJT (bipolar junction transistor) based active circulator, base bias current supply modulator will be used instead of voltage supply modulator to achieve this goal.

In active circulators, it is very important to hold proper $V_{gs}$ and $V_{ds}$ regardless of the power level to maintain the reasonable insertion loss and isolation. This proper bias over the power sweeping can be realized by applying the adjustable voltage source ($V_{gs}$ and $V_{ds}$) and the proposed concept of envelope tracking can be adopted to accomplish this goal.

Figure 3:
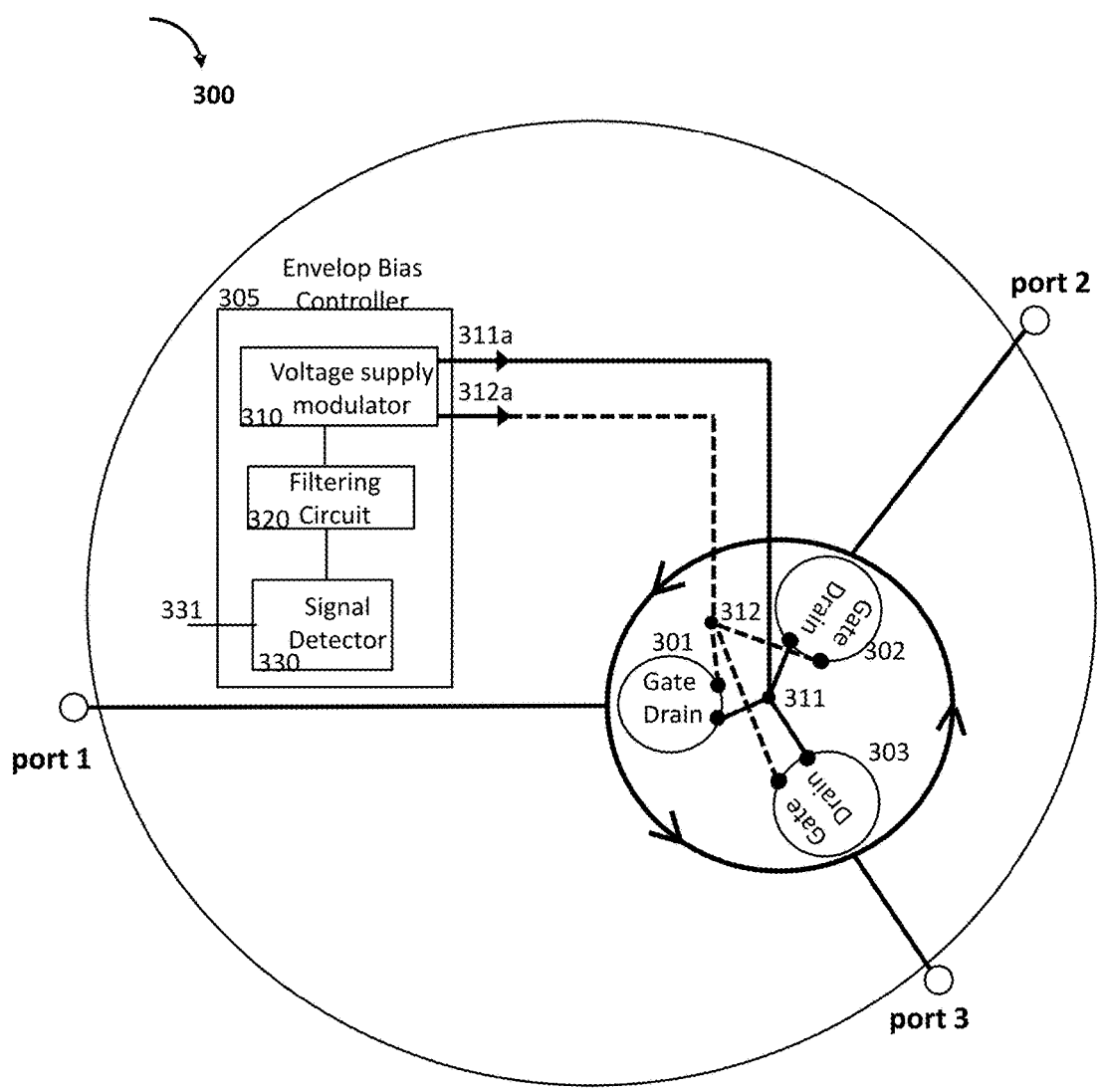
FIG. 3 illustrates a simple configuration of an envelope tracking active circulator, according to an embodiment of the present disclosure.

System 300 in FIG. 3 illustrates the concept of envelope tracking in active circulators, according to an embodiment of the present disclosure. The system comprises of each circulator port (port 1, port 2 and port 3) connected to one or more transistors (301, 302 and 303 respectively) and one or more envelope bias controllers 305. Though FIG. 3 illustrates Field Effect Transistors (FETs), any other type of transistors can be used such as bipolar Junction Transistors (BJT) as long as they are configured to provide similar functions. The envelope bias controller 305 comprises of a signal detector subsystem 330, filtering subsystem 320 and a voltage supply modulator 310. The gates of the transistors 301, 302 and 303 are connected to a common node 312 and controlled by gate voltage $V_{gs}$ 312a from the voltage supply modulator 310 inside the envelope bias controller 305. Similarly, the Drains of these transistors are also connected to a common node 311 and controlled by drain voltage $V_{ds}$ 311a supplied by the voltage supply modulator 310. One or more of each port input power 331 is detected by a signal detector subsystem 330. This detected signal can be properly transformed into low frequency envelope signal. The detection subsystem 330 can be of any type of detection circuit, such as reverse schottky diode, resistor sensing or direct power coupling. Envelope signal transformation from the detected signal can be done by using proper filtering circuit subsystem 320. The most commonly used filtering subsystem 320 is a low pass filtering system, but other harmonic filtering can also be used depending on the system requirement. The filtered signal from the subsystem 320 is then sent to a voltage supply modulator subsystem 310. The voltage supply modulator 310 will be controlled by the envelope signal information from the filtering subsystem 320 and is used to shape the proper voltage magnitude for the gate and drain bias over the input power level. When the voltage source modulator 310 modulates the bias voltages $V_{gs}$ and $V_{ds}$, it has to take proper modulation function of the envelope signal and has to be fast enough to follow the envelope signal frequency. Since the timing delay occurs through the detector 330, filtering (320) and voltage modulator (310) subsystems, timing synchronizing technique has to be applied to synchronize the phases of the input signal 331 and modulated voltages 311a and 312a at the output of the envelope bias controller 305.

For a BJT (bipolar junction transistor) based active circulator, base bias current supply modulator will be used instead of voltage supply modulator to achieve this goal. The envelope bias controller 305 will supply a modulated base bias current tracking the input power envelope. In the description that follows, it is implied that FET terminologies can be replaced by equivalent BJT terminologies and the envelope bias controller modulating the base current based on the input power envelope instead of the gate and drain bias voltages.

If the power of each port is not the same, such as transceiver with antenna for radar application, the highest power (i.e. Tx port) will be detected and supply modulator will be controlled by this envelope information. Typically, all the $V_{gs}$'s are controlled by the same modulated voltage and all the $V_{ds}$'s are controlled by the same modulated voltage, each modulated by the envelope signal. But, if each transistor doesn't need to keep the same bias condition to improve any particular port's insertion loss compromising isolation or vice versa, each gate and drain can be controlled by separate envelope bias controller 305 with different voltage amplitudes.

Figure 2:
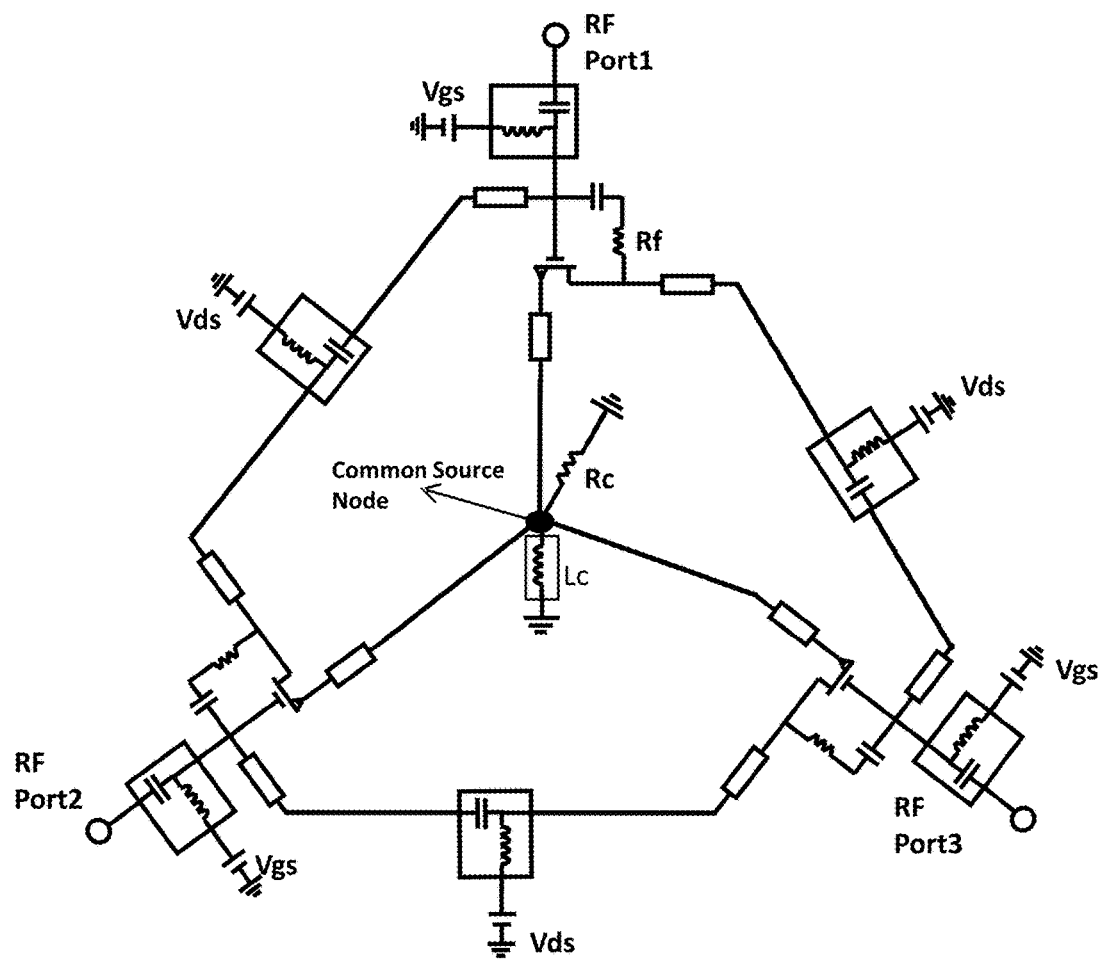
FIG. 2 illustrates an improved active circulator as disclosed in application Ser. No. 14/554,995 filed on Nov. 26, 2014.

To validate the envelope tracking active circulator concept, CMOS based active circulator design was designed and simulated using ADS (Advanced Design System). Basic circuit architectures of FIGS. 2 and 3 are modeled and simulation results are compared to analyze the benefit of the current inventive concept. Instead of designing specific envelope detector, filter and modulator, the input power level is read from the simulation setting, and gate and drain voltage ($V_{gs}$ and $V_{ds}$) on the simulation takes the function of the input power level, so $V_{gs}$ and $V_{ds}$ are emulated like real envelope tracking to have the same effect. Table 1 shows the basic design parameter of the designed active circulator used in the simulation.

TABLE 1

| Design parameter of the active circulator | |
|---|---|
| Process | IBM8HP BiCMOS |
| Transistor | NFET 20 × 0.12 um × 5 um |
| Vdd | 1 V |
| Vgs | 0.55 V |

TABLE 1-continued

| Design parameter of the active circulator | |
|---|---|
| Process | IBM8HP BiCMOS |
| Rf | 110 Ohm |
| Rcm | 350 Ohm |

Figure 4B:
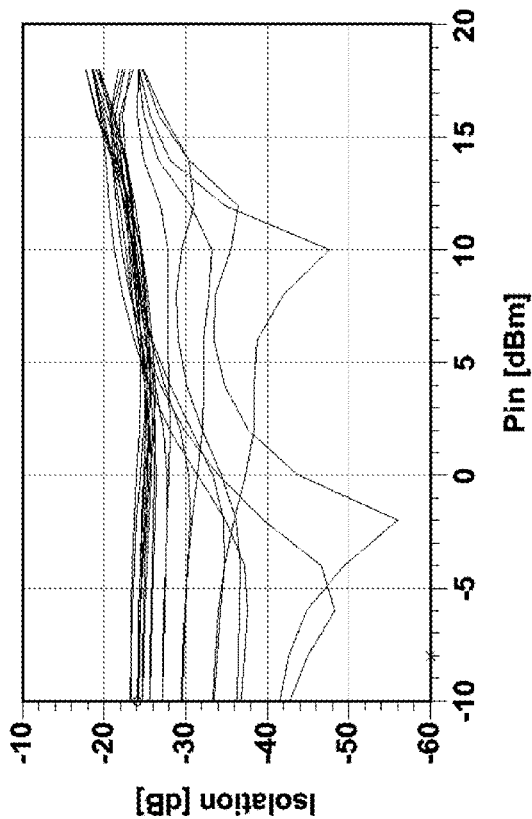
FIG. 4b illustrates simulation results comparing isolation characteristics over input power for both a fixed bias circulator and an envelope tracking circulator, according to an embodiment of the present disclosure.
Figure 4A:
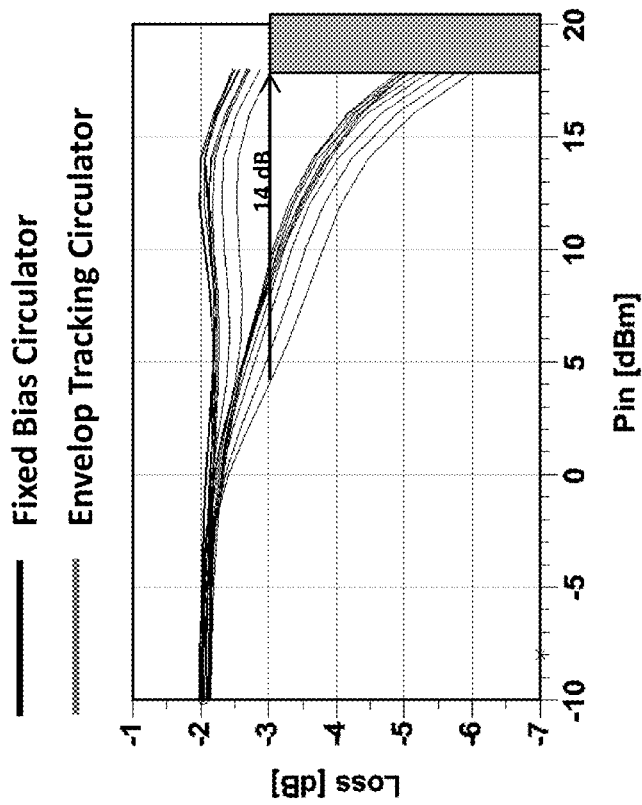
FIG. 4a illustrates simulation results comparing loss performance characteristics over input power for both a fixed bias circulator and an envelope tracking circulator, according to an embodiment of the present disclosure.
Figure 5:
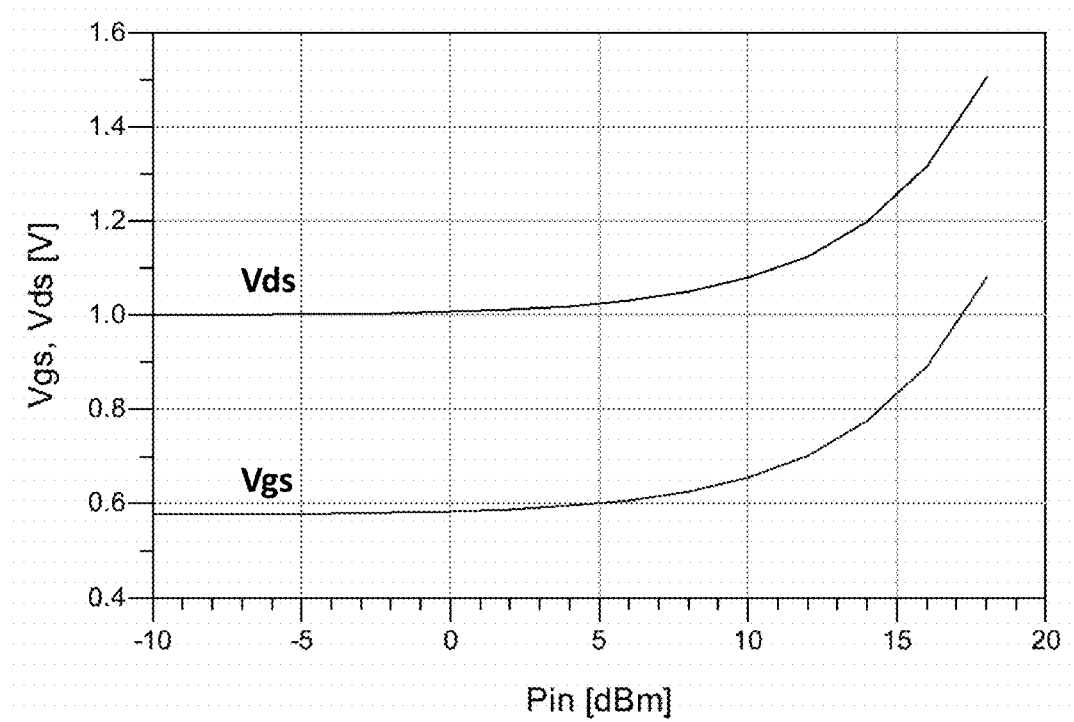
FIG. 5 illustrates simulation results comparing the controlled gate and drain bias voltages over input power, according to an embodiment of the present disclosure.

The results of the simulation are illustrated in FIGS. 4a, 4b and in FIG. 5. FIG. 4a shows the simulation comparison. FIG. 4a illustrates simulation results comparing loss performance characteristics over input power for both a fixed bias circulator and an envelope tracking circulator, according to an embodiment of the present disclosure. FIG. 4b illustrates simulation results comparing isolation characteristics over input power for both a fixed bias circulator and an envelope tracking circulator, according to an embodiment of the present disclosure. For this simulation, frequency is swept from 0.1 GHz~2.1 GHz with −10~18 dBm sinusoidal input power. Under the fixed bias condition, 1 dB insertion loss compression point (~3 dB loss) occurs around 4~9 dBm input power (FIG. 4a). But, the envelope tracking circulator improves the 1 dB compression point by 14 dB, maintaining or improving isolation (FIG. 4b).

FIG. 5 illustrates simulation results comparing the generated controlled gate and drain bias voltages over input power, according to an embodiment of the present disclosure. In this simulation, $V_{ds}$ and $V_{gs}$ are scaled and modulated by the relation $$V_{ds}=V_{ds0}+8(P_{in}),$$

$$V_{gs}=V_{gs0}+8(P_{in}),$$

where $V_{ds0}$ and $V_{gs0}$ are the initial drain and gate bias points respectively and $P_{in}$ is the input power level. The results of FIG. 5 illustrate how the gate and drain bias voltages are modulated as a function of input power. The simulation tracks the power envelope dynamically.

Figure 6:
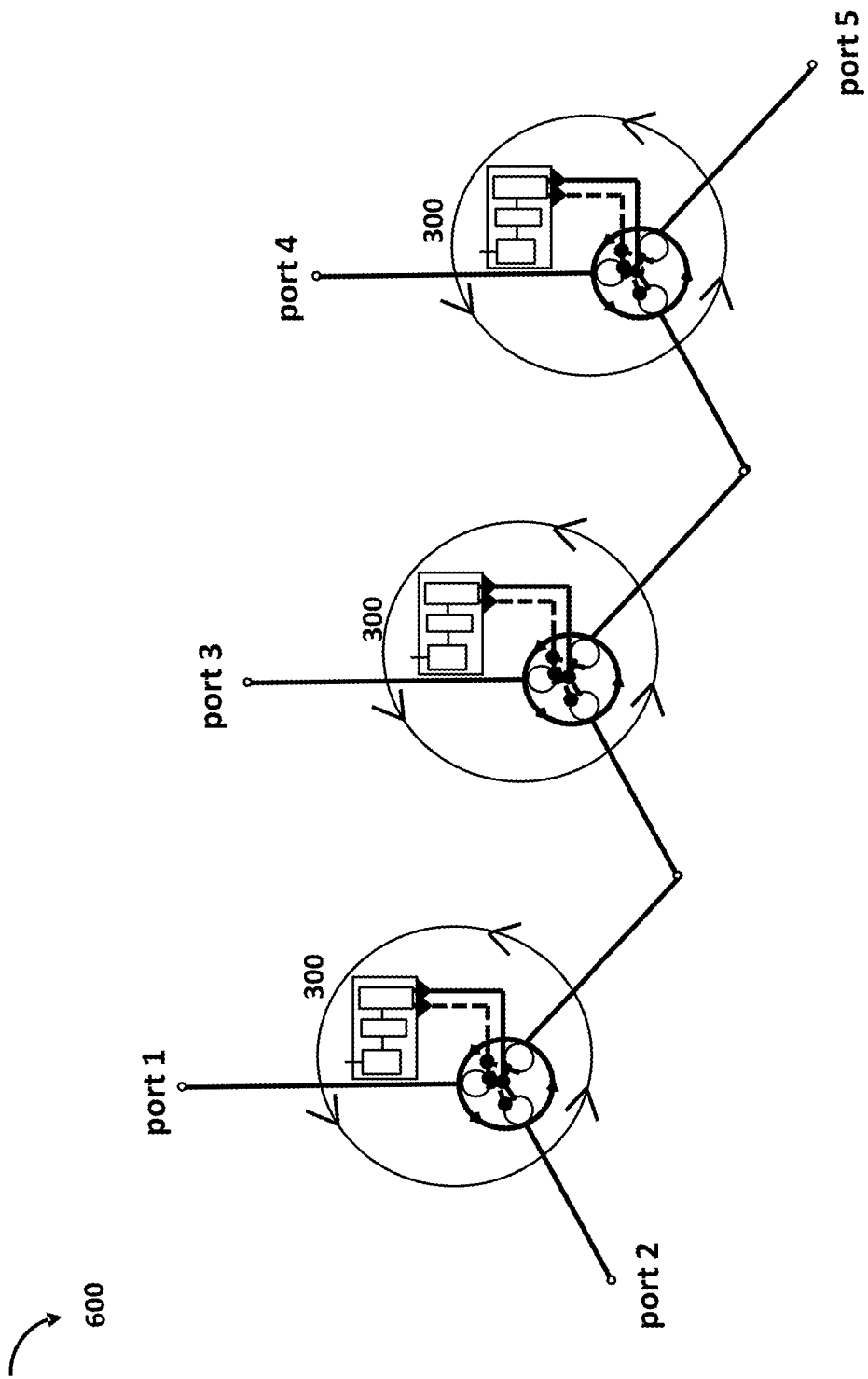
FIG. 6 illustrates cascaded envelope tracking active circulators, according to an embodiment of the present disclosure.

As illustrated in system 600 in FIG. 6, circulators 300 using this envelope tracking concept can be cascaded. The circulators 700 and 800 described later can also be used instead of the circulator 300 in cascading to add additional ports. FIG. 6 illustrates cascading of three circulators 300 to obtain a five port circulator. The cascading can be continued in a similar fashion to obtain any number of ports. Such cascading of envelope tracking circulators will provide for a large number of ports. The $V_{gs}$ and $V_{ds}$ controls based on the input power envelope can be at the individual port level or at the circulator level or for any group of circulators, based on the needs of the application.

Figure 7:
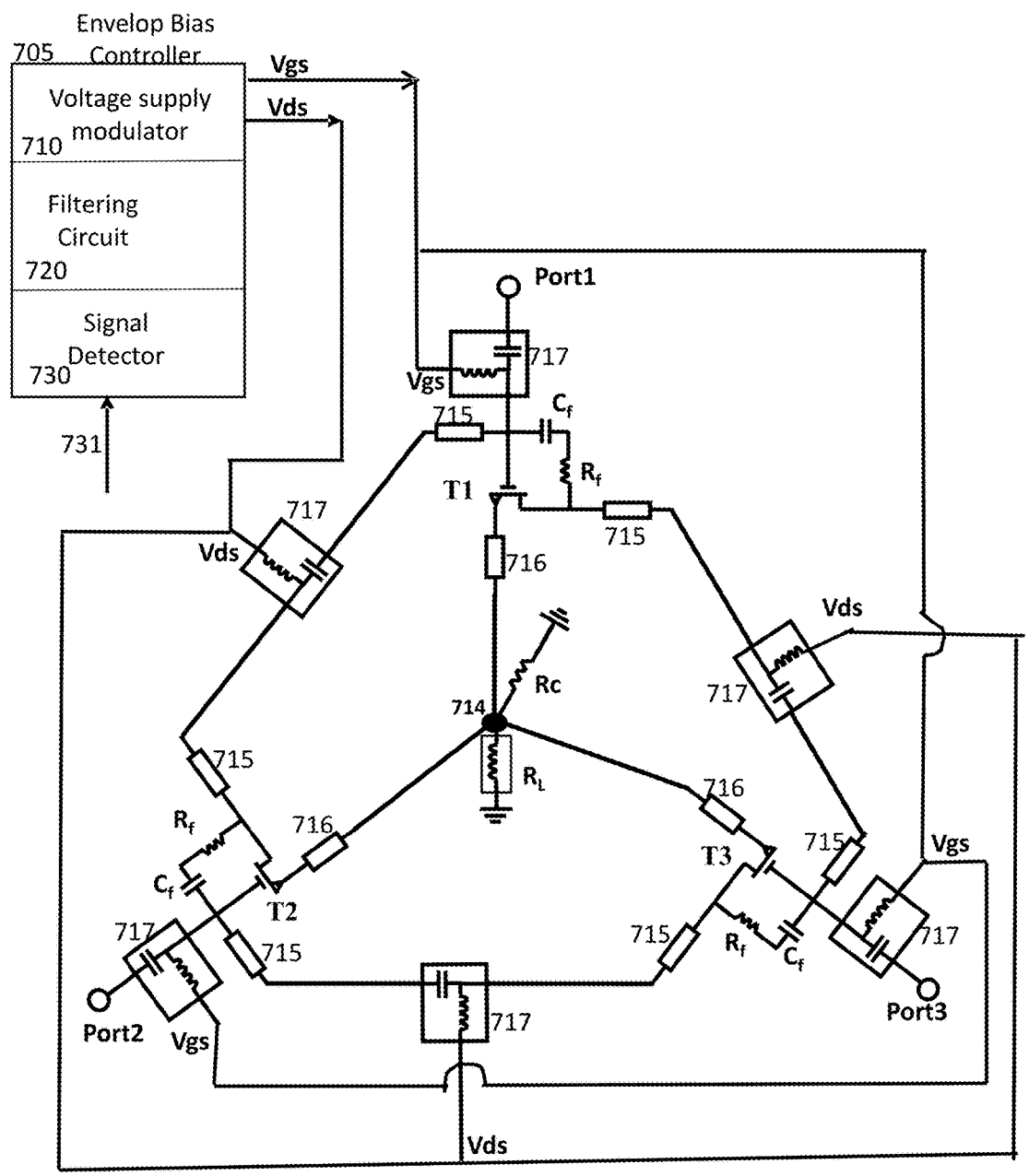
FIG. 7 illustrates another circulator design using the envelope tracking active circulator concept, according to an embodiment of the present disclosure.

Active circulator 700 in FIG. 7 is another embodiment of this technology. Here the gate and drain biases for the transistors T1, T2 and T3 are driven by one or more envelope bias controllers 705. Though FETs are illustrated in FIG. 7, any other transistors including BJTs can be used as long as they are configured to provide similar functionality and the envelope bias controller modulates the base current based on the input power envelope.

Active circulator 700 consists of three (or more) transistors (T1, T2 and T3) arranged in a ring, with RC feedback and common ground resistors. The gate bias $V_{gs}$ of the each of the three transistors T1, T2 and T3 is provided by the envelope bias controller 705 through one of three choke inductors inside each of three RF chokes 717, while the drain bias $V_{ds}$ of the each of the three transistors T1, T2 and T3 is provided by the envelope bias controller 705 through one of three choke inductors inside each of three RF chokes 717. The three transistors T1, T2 and T3 are depicted (according to the symbol used) as being HEMT devices, but the three transistors T1, T2 and T3 can be implemented as other types of transistors including Bipolar Junction Transistors, CMOS Field Effect Transistors, Laterally Diffused Metal Oxide Semiconductor (LDMOS) Transistors, to name a few. However, if a FET-type transistor (HEMT, LDMOS, CMOS, Etc) is utilized as transistors T1, T2 and T3, then the three choke inductors inside each of three RF chokes 717 can be replaced with high resistance resistors, since FET type devices do not draw a bias current at their gates. And all three resistors would be easier to implement than would be a conventional inductor in 717 if new active circulator is implemented as monolithic microwave integrated circuit (MMIC). However, if bipolar transistors are used instead of FETs to implement this technology, then replacing the three choke inductors inside 717 with high resistance resistors would lead to some DC power loss. This will be a tradeoff between ease of implementation and power loss.

Each of the three RF signals for the circulator 700 are applied at the three ports (RF Port1, RF Port2, RF Port2) and are each introduced through a bypass capacitor in each of the RF chokes 717. For a monolithic microwave integrated circuit (MMIC) embodiment, each choke inductor in 717 connected to $V_{gs}$ can be replaced with a high resistance resistor (as mentioned above, particularly if FET-type transistors are used as transistors T1, T2 and T3) and each bypass capacitor in 717 can be implemented as a highly capacitive capacitance (the capacitance of which is preferably sufficiently large to pass the signal with as little loss as reasonable, given the fact that impedance of inductor/resistor should be much greater than the impedance of the capacitor at the frequency of the RF signal at Port1, Port2 or Port3). Alternatively, choke inductors 717 can be replaced with shorted $\lambda/4$ (quarter wave length) transmission line stub or with an active load. Similarly, choke inductors in 717 can be replaced with shorted $\lambda/4$ (quarter wave length) transmission line stub or with an impedance convertor.

The envelope bias controller 705 receives the selected RF input 731. In the case of a single envelope bias controller 705, this RF input 731 is the RF input of the highest power among the RF inputs to the various ports. If the envelope bias controller 705 is used for each transistor or for a group of transistors, the selected RF input 731 to the signal detector is the input RF that has the highest power among the selected group of ports.

The RF input to one of the ports is sent for detection and this detection signal can be properly transformed into low frequency envelope signal. The detection subsystem 730 can be of any type of detection circuit, such as reverse schottky diode, resistor sensing or direct power coupling. Envelope signal transformation from the detected signal can be done by using proper filtering circuit subsystem 720. The most commonly used filtering subsystem 720 is a low pass filtering system, but other harmonic filtering can also be used depending on the system requirement. The filtered signal from the subsystem 720 is then sent to a voltage supply modulator subsystem 710. The voltage supply modulator 710 will be controlled by the envelope signal information from the filtering subsystem 720 and is used to shape the proper voltage magnitude for the gate and drain bias over the input power level. When the voltage source modulator 710 modulates the bias voltages $V_{gs}$ and $V_{ds}$, it has to take proper modulation function of the envelope signal of the input power and has to be fast enough to follow the envelope signal frequency. Since the timing delay occurs through the detector 730, filtering (720) and voltage modulator (710) subsystems, timing synchronizing technique has to be applied to synchronize the phases of the input signal 731 and modulated voltages $V_{gs}$ and $V_{ds}$ at the output of the envelope bias controller 705.

The RF chokes 717 are depicted as a simple LC choke. More complex choke designs and even simpler choke designs may be substituted so long as (i) in the case of RF chokes 717 on the gate side, the gate bias voltage has a DC path to the gate of the particular transistor (T1, T2 or T3) to which it applies a bias voltage or (ii) in the case of RF chokes 717 for the drain side, the bias voltage has a DC path to the drain of the particular transistor (T1, T2 or T3) to which it applies a bias voltage. The internal inductor in the RF Choke 717 may be implemented as a resistor, stub or impedance convertor as mentioned above.

After the RF signal is applied at a port and the transistor whose gate (or control electrode in case a non-FET type transistor is utilized) is directly coupled to the output of the choke at the same gate, the RF signal is sent to the next gate as in the circulator art. With the envelope bias controller 705 controlling the gate and drain biases of all the transistors, the biases are shifted based on the RF input envelope by the envelope bias controller 705 and this in turn substantially increases the power handling capacity of the circulator 700 while increasing its efficiency, reducing the insertion loss and providing more isolation between the ports.

The RF signal paths are shown with elements 715 in those paths. Elements 715 merely denote that those paths are preferable either entirely or partially formed as a microstrip, so the depicted conductors in the RF signal path connecting the output of choke 717 (which is also connected to the gate of T1) to the drain of T2 are preferably implemented as microstrips, particularly if the disclosed active circulator is embodied as a MMIC where these conductors would be spaced from an underlying ground plate (not shown) by a dielectric layer (also not shown) formed as a part of the MMIC.

The sources of the transistors T1, T2 and T3 are each connected by conductor to a central junction point 714, each such conductor being preferably implemented as a microstrips. The central junction point 714 is coupled to DC ground preferably via a parallel arrangement of a resistor $R_c$ and an inductor $R_L$.

Resistors $R_f$ and capacitors $C_f$ provide a feedback path. For normal values, they do not produce any DC loss or significant RF loss. In some embodiments it may be useful to arrange resistors $R_f$ and capacitors $C_f$ in a parallel arrangement as opposed to the series arrangement shown in FIG. 7. Nevertheless, the depicted series arrangement is believed to be superior in order to separate the drain bias voltage from the gate bias voltage.

As shown in FIG. 7, three small value resistors 716 (typically less than 5 ohms each) can be added between the sources of the transistors and the common junction 714. This is for the circulator stability and corresponding DC and RF power loss through these resistors should be negligible.

Figure 1:
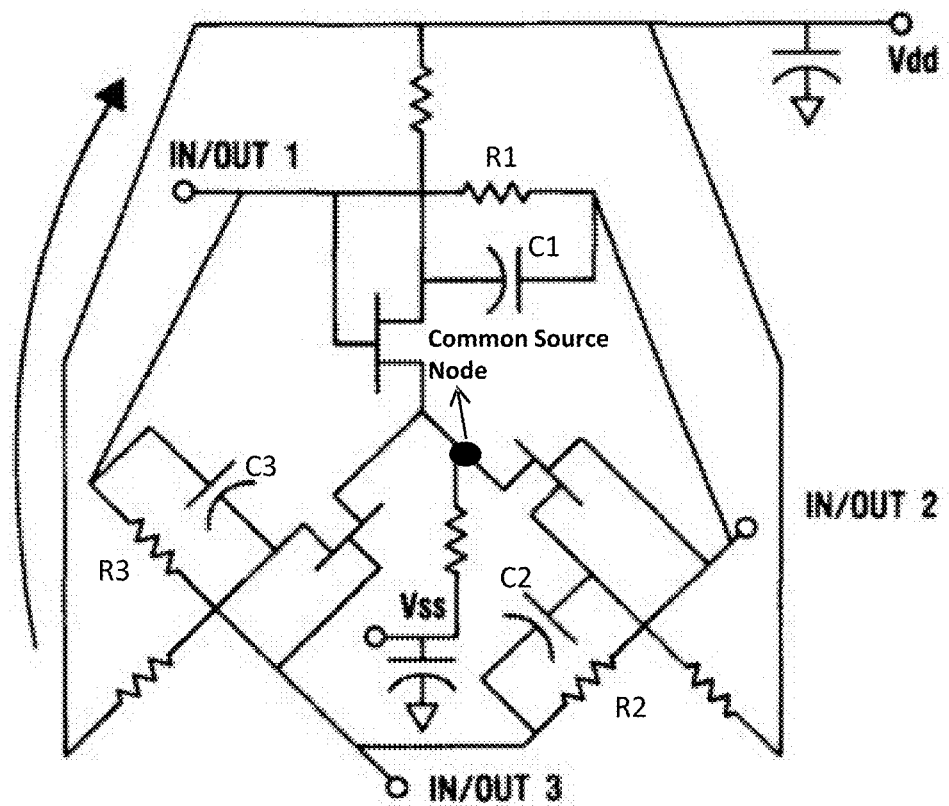
FIG. 1 illustrates a typical prior art active circulator configuration.
Figure 8:
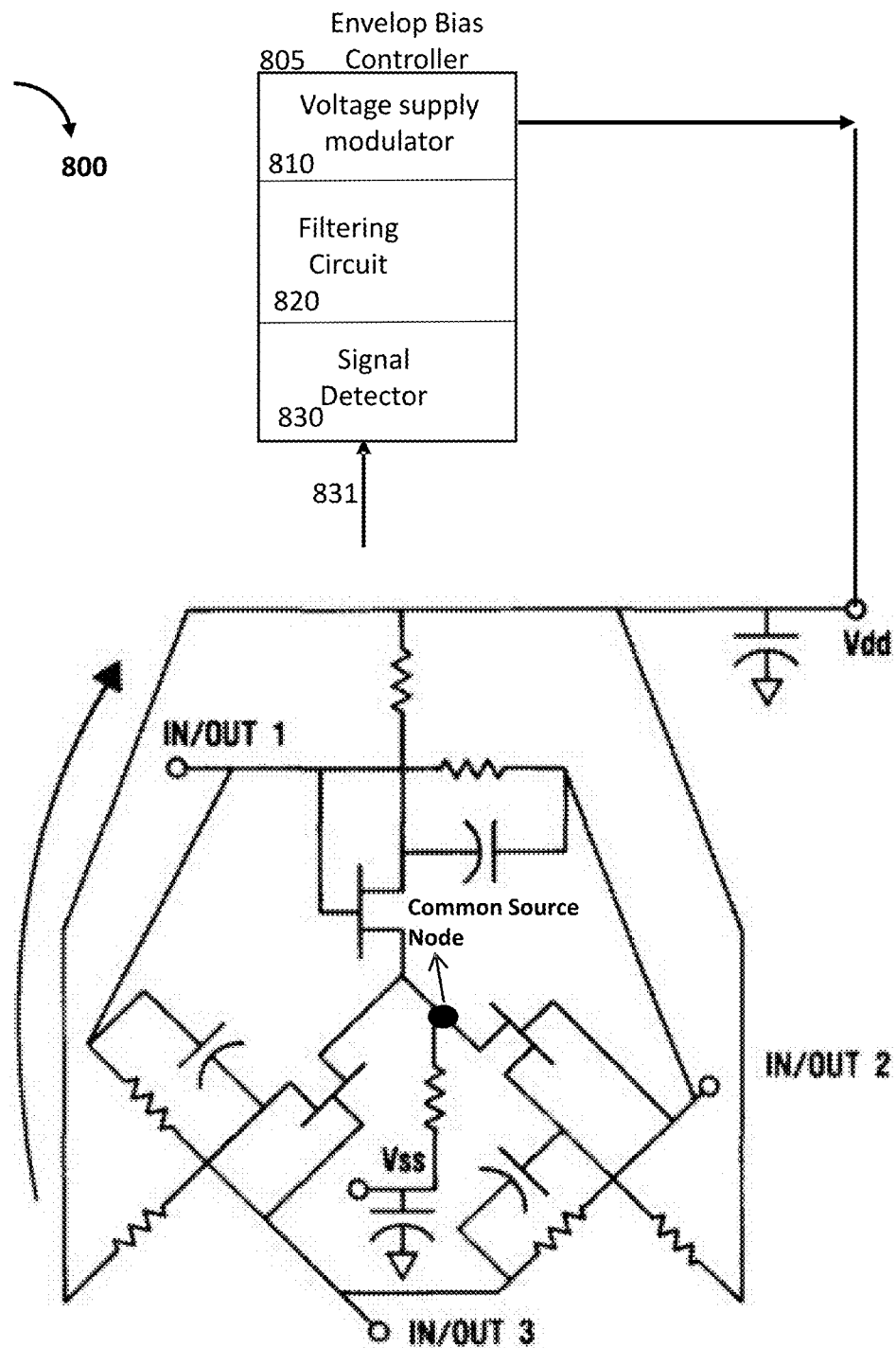
FIG. 8 illustrates modification of traditional active circulator design using the envelope tracking bias generator, according to an embodiment of the present disclosure.

Circulator system 800 in FIG. 8 is another embodiment of the current technology. It augments the conventional circulator shown in FIG. 1 with an envelope bias controller 805 to control the drain bias. This addition of the envelope bias controller 805 allows for shifting the drain bias based on the input power, thus allowing stable operations at high power as explained earlier, thus significantly increasing the power handling capacity of the circulator.

The envelope bias controller 805 receives the selected RF input 831. In the case of a single envelope bias controller 805, this RF input 831 is the RF input of the highest power among the RF inputs to the various ports. If the envelope bias controller 805 is used for each transistor or for a group of transistors, the selected RF input 831 to the signal detector is the input RF that has the highest power input among the selected group of ports.

The RF input is detected and this detection signal can be properly transformed into low frequency envelope signal. The detection subsystem 830 can be of any type of detection circuit, such as reverse schottky diode, resistor sensing or direct power coupling. Envelope signal transformation from the detected signal can be done by using proper filtering circuit subsystem 820. The most commonly used filtering subsystem 820 is a low pass filtering system, but other harmonic filtering can also be used depending on the system requirement. The filtered signal from the subsystem 820 is then sent to a voltage supply modulator subsystem 810. The voltage supply modulator 810 will be controlled by the envelope signal information from the filtering subsystem 820 and is used to shape the proper voltage magnitude for the gate and drain bias over the input power level. When the voltage source modulator 810 modulates the bias voltages $V_{ds}$, it has to take proper modulation function of the envelope signal and has to be fast enough to follow the envelope signal frequency. Since the timing delay occurs through the detector (830), filtering (820) and voltage modulator (810) subsystems, timing synchronizing technique has to be applied to synchronize the phases of the input signal 831 and modulated voltage $V_{ds}$ at the output of the envelope bias controller 705.

In particular configurations, it may be desirable to have individual detector circuits and modulator circuits to control the biases for each port separately. In other applications you can have a common detector, filter and modulating subsystems and have a common bias control for a group of ports and their associated $V_{ds}$ and $V_{gs}$. In some applications, the ability to handle high power may be more important than the DC loss. Of the various embodiments presented, one can generate combination of selected features in the design of these embodiments to meet any given application needs.

Modifications, additions, or omissions may be made to the systems, apparatuses, and methods described herein without departing from the scope of the technology. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

To aid the Patent Office, and any readers of any patent issued on this application in interpreting the claims appended hereto, applicants wish to note that they do not intend any of the appended claims or claim elements to invoke paragraph 6 of 35 U.S.C. Section 112 as it exists on the date of filing hereof unless the words "means for" or "step for" are explicitly used in the particular claim.

What is claimed is:

1. A multi-port bias modulated, active circulator comprising:
    a plurality of transistors having one or more gate biases; and one or more drain biases; and
    one or more envelope bias controllers that generate the one or more gate biases and the one or more drain biases, the envelope bias controllers having inputs, wherein an input to at least one envelope bias controller of the one or more envelope bias controllers is connected to one of the ports of the circulator.

2. The active circulator of claim 1, wherein the transistors are Field Effect Transistors (FETs).

3. The active circulator of claim 1, wherein the circulator has ports, the one or more gate biases are one or more modulated gate biases, and the one or more envelope bias controllers generate the one or more modulated gate biases by modulating a voltage supply signal with an envelope of an input signal from the one of the ports of the circulator.

4. The active circulator of claim 1, wherein the circulator has ports, the one or more drain biases are one or more modulated drain biases, the one or more envelope bias controllers generating the one or more modulated drain biases by modulating a voltage supply signal with an envelope of an input signal from the one of the ports of the circulator.

5. The active circulator of claim 1, wherein the one or more gate biases are one common gate bias and the one or more drain biases are one drain bias, wherein the one common gate bias and the one common drain bias are one common modulated gate bias and one common modulated drain bias, respectively.

6. The active circulator of claim 5, wherein the one common modulated gate bias and the one common modulated drain bias are derived from an envelope of an input signal to the at least one envelope bias controller.

7. The active circulator of claim 1, wherein the one or more envelope bias controllers comprise:
    a signal detector;
    a filtering circuit connected to the signal detector; and
    a bias voltage modulator connected to the filtering circuit, the bias voltage modulator generating the one or more gate biases and the one or more drain biases.

8. The active circulator of claim 1, further comprising:
    a plurality of first RF chokes having capacitors and a plurality of second RF chokes having capacitors, wherein each transistor of the plurality of transistors comprises:
        (i) a gate; and an associated feedback circuit, the gate being connected to a port of the ports of the active circulator via a capacitor of one of the first RF chokes, each of the first RF chokes being connected to a gate and a port of the active circulator, the port being associated with a transistor of the plurality of transistors, and a gate bias of the gate biases;
        (ii) a source connected to a common point of the multi-port bias modulated, active circulator; and
        (iii) a drain connected to the gate of the transistor by the feedback circuit and connected to the gate of a neighboring transistor via a capacitor of one of the second RF chokes, each of the second RF chokes coupling gates and drains of neighboring transistors via the capacitors thereof and each of the second RF chokes being connected to a drain bias of the one or more drain biases.

9. The active circulator of claim 1, wherein the one or more gate biases are one or more common gate biases, and wherein the one or more drain biases are one or more common drain biases.

10. A multi-port transistor-based, active circulator having ports comprising:
    a plurality of transistors having gate biases; and
    at least one envelope bias controlled that generates the gate biases by modulating a voltage supply signal with an
    envelope of an input signal from one of the ports of the circulator.

11. The active circulator of claim 10, wherein the transistors are Field Effect Transistors (FETs).

12. The active circulator of claim 11, wherein the at least one envelope bias controller is one envelope bias controller.

13. The active circulator of claim 12, wherein the input signal from the one of the ports of the circulator has a highest average power compared to the highest average power of each input signal from each other port of the circulator.

14. The active circulator of claim 10, wherein the at least one envelope bias controller comprises:
   a signal detector;
   a filtering circuit connected to the signal detector; and
   a bias voltage modulator connected to the filtering circuit, the bias voltage modulator generating the gate biases.

15. The active circulator of claim 10, further comprising:
   a plurality of first RF chokes having capacitors and a plurality of second RF chokes having capacitors, wherein the plurality of transistors has one or more drain biases generated by the one or more envelope bias controllers, wherein each transistor of said plurality comprises:
      (i) a gate; and an associated feedback circuit, the gate connected to a port of the active circulator via a capacitor of one of the first RF chokes, each of the first RF chokes being connected to a gate and an associated port of the active circulator, the port being associated with a transistor of the plurality of transistors, and a gate bias of the gate biases;
      (ii) a source connected to a common point of the multi-port transistor-based, active circulator; and
      (iii) a drain connected to the gate of the transistor by the feedback circuit and connected to the gate of a neighboring transistor via a capacitor of one of the second RF chokes, each of the second RF chokes coupling gates and drains of neighboring transistors via the capacitors thereof and each of the second RF chokes being connected to the drain bias of the one or more drain biases.

16. The active circulator of claim 10, wherein the one or more gate biases are common drain biases.

17. The active circulator of claim 14, wherein the one or more gate biases are common drain biases.

18. The active circulator of claim 10, wherein the one or more gate biases are one or more common gate biases.

19. A transistor-based active circulator having ports and comprising:
   a plurality of bipolar junction transistors (BJTs) having three or more ports and one or more base nodes; and
   one or more envelope bias controllers that control a base current supply to the one or more base nodes, wherein an input to one of the envelope bias controllers is connected to one of the ports of the active circulator.

20. The active circulator of claim 19, wherein the one or more base nodes are one or more common base nodes.

21. A cascaded arrangement of transistor-based active circulators wherein each of the active circulators has a plurality of ports and wherein each of the active circulators has a port of the plurality of ports connected to a port of another active circulator in the arrangement of active circulators; each of the active circulators having a plurality of transistors, the plurality of transistors having a common gate bias and a drain bias, the cascaded arrangement having one or more envelope bias controllers having inputs and generating the common gate biases and the common drain biases, wherein
   an input of the one or more envelope bias controllers is connected to one of the ports of one of the active circulators of the active circulators.

22. The active circulator of claim 21, wherein the transistors are Field Effect Transistors (FETs).

23. The active circulator of claim 21, wherein the common gate bias of each active circulator is controlled by one envelope bias controller of the one or more envelope bias controllers.

24. The active circulator of claim 23, wherein the common drain bias of each active circulator is controlled by one envelope bias controller of the one or more envelope bias controllers.

25. The active circulator of claim 21, wherein the one or more envelope bias controllers comprise:
   a signal detector;
   a filter circuit connected to the signal detector; and
   a bias voltage modulator connected to the filter circuit, the bias voltage modulator generating the one or more common gate biases and the one or more common drain biases.

26. The active circulator of claim 23, wherein the common gate bias of each active circulator is controlled by only one envelope bias controller.

27. The active circulator of claim 24, wherein the drain bias of each active circulator is controlled by only one envelope bias controller.

28. A bias-controlled, multi-port active circulator comprising:
   a plurality of FET transistors having gates, drains, and associated ports and feedback circuits, the ports being of the active circulator;
   one or more envelope bias controllers with inputs, the one or more envelope bias controllers each generating a common gate bias and a common drain bias, wherein an input of the one or more envelope bias controllers is connected to one of the ports of the active circulator;
   a plurality of first RF chokes having capacitors and a plurality of second RF chokes having capacitors, each FET transistor of said plurality of FET transistors having:
      (i) a gate connected to an associated port of said multi-port active circulator via a capacitor of an associated one of said first RF chokes, each of said first RF chokes being connected to a gate of an associated FET transistor of said plurality of FET transistors, the associated port of said associated FET transistor, and the common gate bias;
      (ii) a source connected to a common point of the multi-port active circulator; and
      (iii) a drain of the FET transistor connected to the gate of the same FET transistor by a feedback circuit and connected to the gate of a neighboring FET transistor via a capacitor of one of the second RF chokes, each of the second RF chokes coupling gates and drains of neighboring FET transistors via the capacitors thereof, the second RF chokes being connected to the drain bias.

* * * * *